US006956287B2

(12) United States Patent
Hedler et al.

(10) Patent No.: US 6,956,287 B2
(45) Date of Patent: Oct. 18, 2005

(54) ELECTRONIC COMPONENT WITH FLEXIBLE BONDING PADS AND METHOD OF PRODUCING SUCH A COMPONENT

(75) Inventors: Harry Hedler, Regensburg (DE); Alfred Haimerl, Sinzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/022,226

(22) Filed: Dec. 17, 2001

(65) Prior Publication Data

US 2002/0089058 A1 Jul. 11, 2002

Related U.S. Application Data

(63) Continuation of application No. PCT/DE00/01123, filed on Apr. 11, 2000.

(30) Foreign Application Priority Data

Jun. 17, 1999 (DE) .......................................... 199 27 750

(51) Int. Cl.[7] ....................... H01L 23/053; H01L 23/12; H01L 21/44; H01L 21/48; H01L 21/50

(52) U.S. Cl. ....................................... 257/701; 438/125

(58) Field of Search .......................... 257/701; 438/125

(56) References Cited

U.S. PATENT DOCUMENTS

| | | | | | |
|---|---|---|---|---|---|
| 3,641,254 | A | * | 2/1972 | Bunting et al. | 174/253 |
| 5,508,228 | A | | 4/1996 | Nolan et al. | |
| 5,685,885 | A | | 11/1997 | Khandros et al. | |
| 5,874,782 | A | | 2/1999 | Palagonia | |
| 5,910,687 | A | * | 6/1999 | Chen et al. | 257/784 |
| 6,075,712 | A | * | 6/2000 | McMahon | 361/783 |
| 6,140,456 | A | * | 10/2000 | Lee et al. | 528/196 |
| 6,309,798 | B1 | * | 10/2001 | Reetz et al. | 430/296 |
| 6,319,564 | B1 | | 11/2001 | Naundorf et al. | |

FOREIGN PATENT DOCUMENTS

| | | |
|---|---|---|
| JP | 01-187948 | 7/1989 |
| JP | 04 280 458 | 10/1992 |
| JP | 05 251 455 | 9/1993 |
| JP | 06 084 917 A | 3/1994 |
| JP | 11 067 776 A | 3/1999 |
| JP | 2003-502866 | 1/2003 |
| WO | WO 98/52225 | 11/1998 |
| WO | WO 98/55669 | 12/1998 |
| WO | WO 99/05895 | 2/1999 |

* cited by examiner

*Primary Examiner*—Craig A. Thompson
*Assistant Examiner*—Nema Berezny
(74) *Attorney, Agent, or Firm*—Laurence A. Greenberg; Werner H. Stemer; Ralph E. Locher

(57) ABSTRACT

An electronic component with an electronic circuit and electrical contacts, disposed at least on a first surface of the electronic component, for the electrical bonding of the electronic circuit includes at least one flexible elevation of an insulating material disposed on the first surface, at least one electrical contact disposed on the flexible elevation, and a conduction path disposed on the surface or in the interior of the flexible elevation between the electrical contact and the electronic circuit. A method for producing the electronic component is also provided.

20 Claims, 3 Drawing Sheets

ELECTRONIC COMPONENT WITH FLEXIBLE BONDING PADS AND METHOD OF PRODUCING SUCH A COMPONENT

CROSS-REFERENCE TO RELATED APPLICATION

This application is a continuation of copending International Application No. PCT/DE00/01123, filed Apr. 11, 2000, which designated the United States.

BACKGROUND OF THE INVENTION

Field of the Invention

The invention relates to an electronic component with an electronic circuit and electrical contacts, at least on a first surface of the electronic component, which serve for the electrical bonding of the electronic circuit.

Electrical bonding of these components, for example, by solder balls, contact pins, or direct soldered connections between the electronic component and a carrier on which the component is to be mounted, is problematical to the extent that thermal loading may cause different linear expansion of the electronic component and the carrier. The expansion results in mechanical stresses at the soldered connections between the carrier and the electronic component. Such stresses may also occur, however, as a result of other mechanical loads on the component or the carrier. One consequence of these stresses is the risk of the soldered connections between the component and the carrier being damaged or destroyed.

As disclosed by U.S. Pat. No. 5,685,885 to Khandros et al., the prior art places electrical contacts on a flexible layer. However, the layer has proven to be insufficiently elastic for the mechanical stresses occurring to be optimally absorbed. Moreover, the production of components with the layer disclosed there is relatively complicated.

SUMMARY OF THE INVENTION

It is accordingly an object of the invention to provide an electronic component with flexible bonding pads and method of producing such a component that overcomes the hereinafore-mentioned disadvantages of the heretofore-known devices and methods of this general type and that has the component being less sensitive to mechanical stresses in the region of the electrical contacts With the foregoing and other objects in view, there is provided, in accordance with the invention, an electronic component including an electronic circuit having a first surface, electrical contacts at least on the first surface for electrical bonding of the electronic circuit, at least one elevation disposed on the first surface, the at least one elevation having an elevation surface and a contact zone, the at least one elevation being formed of an insulating material having sufficient flexibility to absorb stresses occurring in the contact zone as a result of at least one of the group consisting of thermal loading and mechanical loading, at least one of the electrical contacts disposed on the at least one elevation, and a conduction path disposed on the elevation surface between the at least one of the electrical contacts and the electronic circuit.

With the objects of the invention in view, there is also provided an electronic component including an electronic circuit having a first surface, electrical contacts at least on the first surface for electrical bonding of the electronic circuit, at least one elevation disposed on the first surface, the at least one elevation having a contact zone and an interior, the at least one elevation being formed of an insulating material having sufficient flexibility to absorb stresses occurring in the contact zone as a result of at least one of the group consisting of thermal loading and mechanical loading, at least one of the electrical contacts disposed on the at least one elevation, and a conduction path disposed in the interior between the at least one of the electrical contacts and the electronic circuit.

According to the invention, at least one flexible elevation of an insulating material is provided on the first surface of the electronic component on which the electrical contacts of the component are disposed, at least one electrical contact being disposed on the at least one flexible elevation. The configuration, consequently, achieves an elastic attachment of the electrical contacts on the electronic component so that, under thermal or mechanical loading of the component, the corresponding stresses are absorbed by the flexible elevation. The feature is possible much better in the case of an elevation, as opposed to a straight-extending layer according to the prior art, because the elevation has a greater freedom of movement and, therefore, can compensate for greater tolerances.

U.S. Pat. No. 5,874,782 to Palagonia shows elevations of different materials. However, Palagonia is only concerned with purely geometrical considerations, that is, the bridging of the distance between two planes in contact with each other. The distance is then filled with insulating plastic. As a result, even if materials that are intrinsically flexible are used for the elevations, compensation for the stresses resulting from thermal or mechanical loads cannot take place.

The configuration according to the invention has special significance in the case of electronic components of a size corresponding largely to the size of the electronic circuit, or of the circuit chip of the component, that is, in the case of what are referred to as chip-size components. Because, apart from the electronic circuit or apart from the circuit chip, here there are virtually no other housing elements that can absorb stresses on the electronic component, in the case of such components, there is a particularly high risk of the electrical contacts being damaged or destroyed. Particularly in such a case, the occurrence of excessive mechanical stresses can be avoided, and, consequently, the operational reliability of the component ensured, by a flexible elevation such as that proposed according to the invention.

Consequently, the electrical contacts of the electronic component are disposed on a flexible elevation that compensates for the mechanical stresses occurring. To establish a conducting connection to an electrical contact on an elevation, it may be provided, for example, that a conduction path is disposed on the surface of the flexible elevation between the electrical contact and the electronic circuit. The electronic circuit may, for example, directly adjoin the flexible elevation, but it may also be provided that additional conductor runs are disposed between the flexible elevation and the electronic circuit, so that the flexible elevation can be disposed at a distance from the electronic circuit.

As an alternative to a conduction path on the surface of the flexible elevation, a conduction path may also be disposed in the interior of the flexible elevation between the electrical contact and the electronic circuit. Consequently, the conducting connection is led from the electrical contact on the flexible elevation through the flexible elevation and to the electronic circuit.

In principle, the entire flexible elevation may also be produced from a flexible and electrically conductive material, so that the conducting connection is not established by a separate conduction path of a different material but by the flexible material itself. However, very specific materials are necessary to achieve such a configuration, restricting the selection of flexible materials and their composition. Moreover, such materials are generally more resistive than a pure conductive material that forms a conduction path. In the solution according to the invention, a separate optimization of the flexible characteristics and conduction characteristics of the elevation is consequently possible.

If further conductor runs are provided between the electronic circuit and the flexible elevation, in accordance with another feature of the invention, they may be disposed on an insulating layer that at least partially covers the first surface of the electronic component, with the insulating layer adjoining the flexible elevation. This has the advantage that a structuring of the conductor runs can be performed, for example by indirect structuring, to be specific by structuring of the insulating layer.

The electronic component may in principle be configured in any suitable usable form. For example, the component may be a semiconductor component or a polymer component. The electrical contact on the flexible elevation can also be of any desired form and can be adapted to the respective specific use of the electronic component. For example, in accordance with a further feature of the invention, a conducting layer, a conducting pin, or a conducting ball may form the electrical contact.

In accordance with an added feature of the invention, the insulating layer at least partially covers the elevation.

In accordance with an additional feature of the invention, the insulating layer is elastic.

With the objects of the invention in view, there is also provided a method of producing an electronic component, including the steps of providing an electronic component having an electronic circuit with a first surface and electrical contacts at least on the first surface for electrical bonding of the electronic circuit, forming at least one elevation on the first surface by one of the group consisting of applying the elevation with a pressure process, injection molding the elevation, and injection-compression molding the elevation, the elevation having an elevation surface and a contact zone, the elevation being of an insulating material having sufficient flexibility to absorb stresses occurring in the contact zone as a result of at least one of the group consisting of thermal loading and mechanical loading, providing at least one of the electrical contacts on the elevation, and providing a conduction path on the elevation surface between the at least one of the electrical contacts and the electronic circuit.

The application of the flexible elevation to the electronic component is performed in the method by a pressure process, which can be carried out easily and at low cost. The requirements for the fastening tolerances for such elevations are satisfied by existing pressure processes.

With the objects of the invention in view, there is also provided a method of producing an electronic component, including the steps of providing an electronic component having an electronic circuit with a first surface and electrical contacts at least on the first surface for electrical bonding of the electronic circuit, forming at least one elevation on the first surface by one of the group consisting of applying the elevation with a pressure process, injection molding the elevation, and injection-compression molding the elevation, the elevation having an elevation surface and an interior, the elevation being of an insulating material having sufficient flexibility to absorb stresses occurring in the contact zone as a result of at least one of the group consisting of thermal loading and mechanical loading, providing at least one of the electrical contacts on the elevation, and providing a conduction path in the interior of the elevation between the at least one of the electrical contacts and the electronic circuit.

Alternatively, in accordance with yet another mode of the invention, the flexible elevation may be provided by injection molding or injection-compression molding. In such an embodiment, in accordance with yet a further mode of the invention, a thermoplastic or thermosetting material is used as the elevation material. Instead, plastics based on acrylonitrile-butadiene-styrene (ABS), polycarbonate (PC), polyamide (PA) or polyphenylene oxide (PPO) could also be used.

In accordance with yet an additional mode of the invention, the elevation surface is roughened after the elevation has been applied, at least in a region of the later-produced conduction path.

In accordance with again another mode of the invention, the first surface is at least partially covered with an insulating layer adjoining the elevation by applying the insulating layer with a pressure process, and conductor runs are provided on the insulating layer to form a conducting connection between the elevation and the electronic circuit.

In accordance with again a further mode of the invention, the conduction path providing step is carried out by depositing a conducting material on the roughened elevation surface.

In accordance with again an added mode of the invention, the covering step is carried out by one of the group consisting of injection molding the insulating layer and injection-compression molding the insulating layer.

In accordance with again an additional mode of the invention, a surface of the insulating layer is roughened at least in a region of conductor runs to be formed.

In accordance with still another mode of the invention, the insulating layer is roughened using a laser.

In accordance with yet an added mode of the invention, nuclei are depositing on the elevation surface after the elevation surface has been roughened and before a conducting material has been applied to form the conduction path in the interior of or on the surface of the elevation.

In accordance with a concomitant mode of the invention, nuclei are deposited on the surface of the insulating layer after the surface of the insulating layer has been roughened and before a conducting material has been applied to form conduction paths on the surface of the insulating layer.

Similarly, the application of the insulating layer may also be performed by a pressure process. The conducting material for producing the conductor runs or the conduction paths and the electrical contacts may be applied to the flexible elevation or to the insulating layer by customary methods, such as, for example, sputter metallization or chemical metallization. Specific methods to achieve the application are described in International PCT publication WO 98/55669, corresponding to U.S. Pat. No. 6,319,564 B1 to Naundorf et al. and International PCT publication WO 99/05895, with initial nucleation in an insulating layer and subsequent metallization of these regions. As an alternative to these prior-art methods, in accordance with yet an added mode of the invention, a roughening of the surface is performed by laser treatment of the surface of the flexible elevation, and possibly also of the flexible layer, or by some other suitable method, offering better adhesion for the conducting material of the metallization to be applied later.

It may also be provided in such a case that, before the metallization is applied and after the surface has been roughened, metal nuclei or other suitable nuclei, which may be of any suitable material, for example, palladium, are applied to the rough surface.

Other features that are considered as characteristic for the invention are set forth in the appended claims.

Although the invention is illustrated and described herein as embodied in an electronic component with flexible bonding pads and method of producing such a component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a cross-sectional view of the semiconductor chip of FIG. 1 after a flexible elevation has been pressed on;

DESCRIPTION OF THE PREFERRED EMBODIMENTS

In the figures of the drawings, unless stated otherwise, identical reference symbols denote identical parts.

Figure 1:
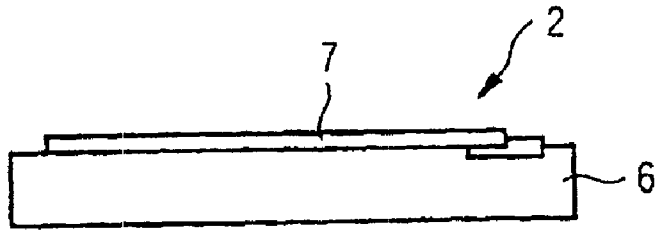
FIG. 1 is a cross-sectional view of a semiconductor chip after an insulating layer has been pressed on according to the invention.

The production of an electronic component that has a flexible elevation according to the invention is explained referring, for example, to FIGS. 1 to 5. As FIG. 1 shows, an insulating layer 7, which at least partially covers a first surface 2 of a semiconductor chip 6, is first applied to the semiconductor chip 6. The application and structuring of the insulating layer 7 can be performed by customary methods, but, ideally, a pressure method, which can be carried out easily and at low cost, is used.

Figure 2:
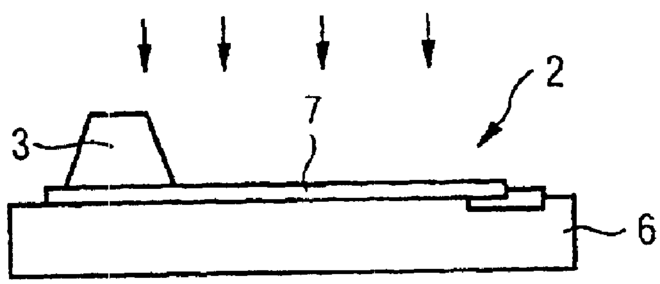

As FIG. 2 shows, a flexible elevation 3 is subsequently applied to the semiconductor chip 6 in the region of the first surface of the chip 6, it being possible for the flexible elevation 3 to be disposed on or next to the insulating layer.

A roughening of the surface of the flexible elevation 3 and of the insulating layer 7 with the aid of a laser may then be performed in those regions in which conduction paths 8 and conductor runs 4 are to be formed in a later step. The vertical arrows in FIG. 2 indicate such roughening. The rough surface provides, in particular, better adhesion of the conducting material of the conduction paths 8 and conductor runs 4 on the respective surfaces.

Figure 3:
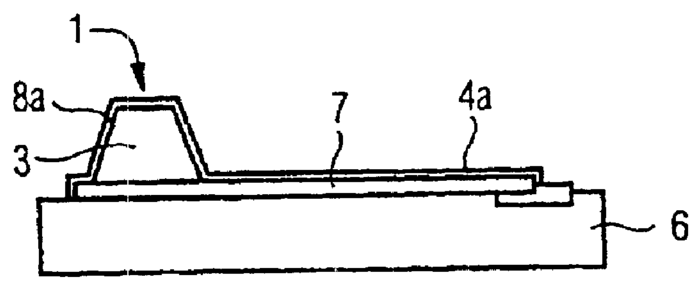
FIG. 3 is a cross-sectional view of the semiconductor chip of FIG. 2 after a first metallization has been applied.
Figure 4:
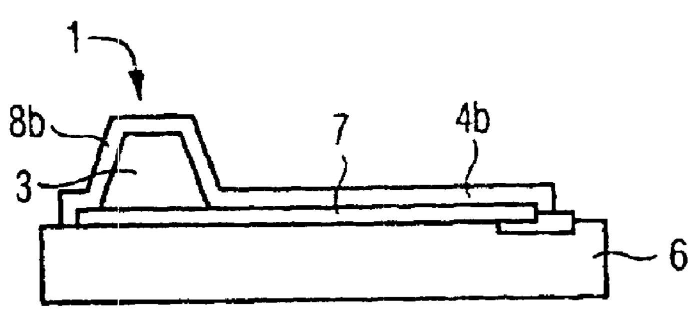
FIG. 4 is a cross-sectional view of the semiconductor chip of FIG. 3 after a second metallization has been applied.
Figure 5:
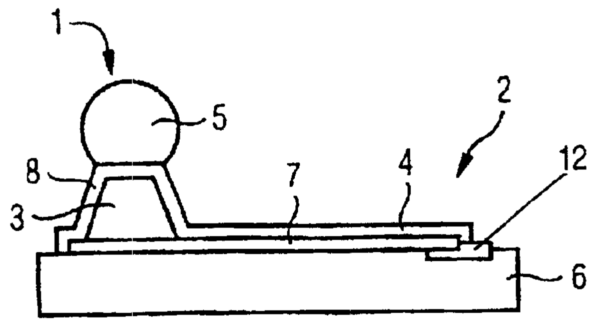
FIG. 5 is a cross-sectional view of the semiconductor chip of FIG. 4 after a solder ball has been applied to the contact pad.

Subsequently, a metallization is applied to the surface of the flexible elevation 3 and also to the surface of the insulating layer 7. As FIGS. 3 and 4 show, the metallization may be performed, for example, in two steps, initially producing a first basic metallization 4*a*, 8*a*, or nuclei 4*a*, 8*a* deposited on the surface, respectively serving for the formation of conductor runs on the insulating layer and a conduction path on the flexible elevation. The nuclei 4*a*, 8*a* may be of any suitable material, such as palladium, for example. A final metallization 4*b*, 8*b* is subsequently performed for the final production of the conductor runs and conduction paths. The metallization 4*b*, 8*b* already forms an electrical contact 1 on the flexible elevation 3, allowing the electrical bonding of the electronic component. As FIG. 5 shows, as an alternative, a solder ball 5 may be additionally attached on the flexible elevation 3 and form the electrical contact 1.

Figure 6:
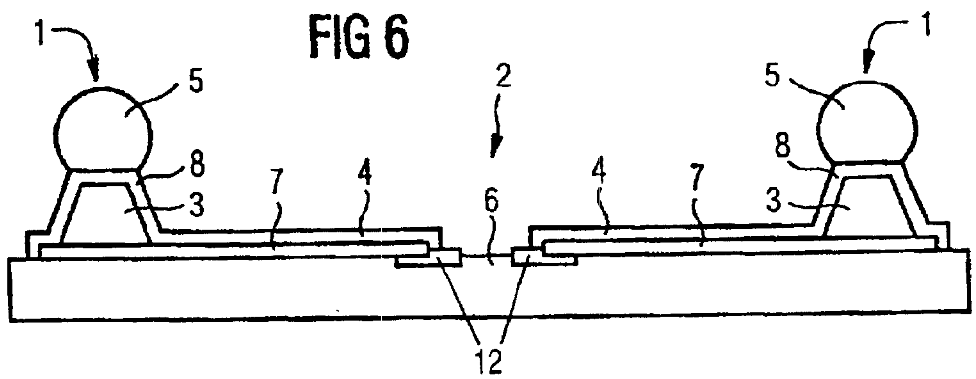
FIG. 6 is a cross-sectional view of an overall view o f the partial component of FIG. 5.

FIG. 6 schematically shows an overall cross-section of an exemplary embodiment of the electronic component. In FIG. 6, the flexible elevations 3 are shown on the edge of the electronic component. Also shown are the conductor runs 4 leading to the corresponding terminals 12 of a non-illustrated electronic circuit in the semiconductor chip 6. However, the elevations 3 may also be disposed in a suitable way such that they are distributed over the entire first surface 2.

Figure 7:
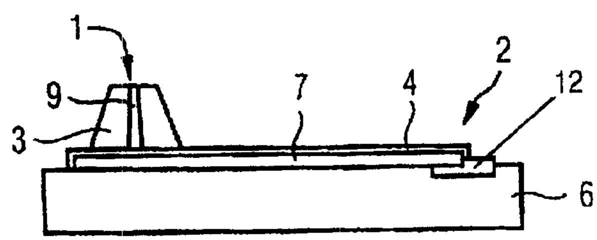
FIG. 7 is a cross-sectional view of an alternative embodiment of the conducting connection of FIGS. 3 and 4.

Represented in FIG. 7 is an alternative to the conduction paths of FIGS. 3 and 4. Here, a conduction path 9 leads through the flexible elevation 3. Such a configuration can be produced, for example, by an insulating layer 7 first being applied to the semiconductor chip 6, as in FIG. 1. Subsequently, a metallization is placed for producing conductor runs 4 on the insulating layer 7. Only then is the flexible elevation 3 applied, for example, by a pressure process. Finally, a conduction path 9 is formed in the interior of the flexible elevation 3, for example, by laser structuring from the surface of the flexible elevation 3 with a subsequent metallizing.

Figure 8:
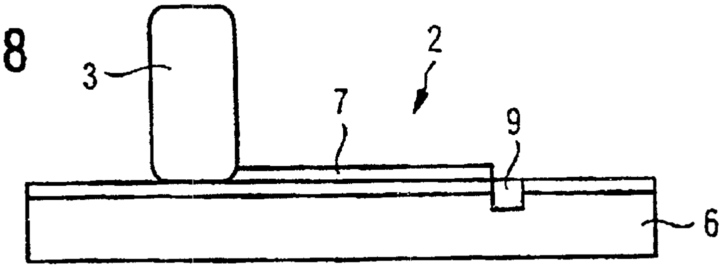
FIG. 8 is a cross-sectional view of a semiconductor chip according to the invention after injection-compression molding of a semi-elastic, flexible elevation and an insulating layer.
Figure 9:
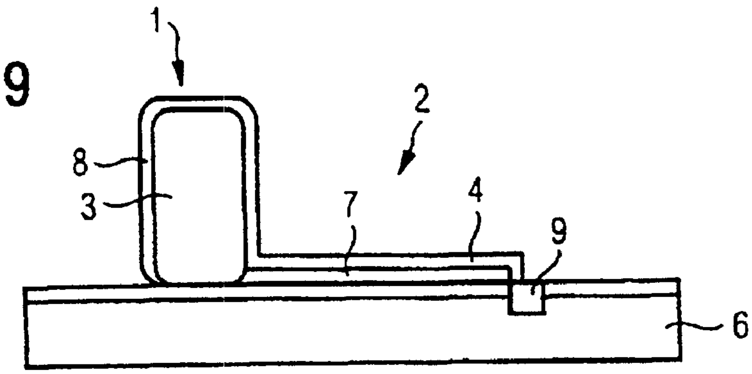
FIG. 9 is a cross-sectional view of the semiconductor chip of FIG. 8 after a metallization has been applied.

The production of an electronic component, in which the flexible elevation according to the invention is produced by injection-compression molding, is now explained by way of example in FIGS. 8 and 9.

FIG. 8 shows a semiconductor chip 6, which is represented schematically. An insulating layer 7 and a flexible elevation 3 have been applied to the chip 6. The injection-compression molding now makes it possible in an advantageous way for the insulating layer 7 and the flexible elevation 3 to be applied in a single operation. For such a purpose, a correspondingly non-illustrated shaped mold is prepared, into which a plastic, for example, a thermoplastic or thermosetting material, is introduced. The insulating layer 7 and the flexible elevation 3 are preformed in the mold. Subsequently, in a compressing operation, the mold is placed onto the first surface 2 of the semiconductor chip 6 and the plastic, for example, a semi-elastic material (insulating layer 7, flexible elevation 3), is bonded to the semiconductor chip 6. The injection-compression molding makes it easier for the process to be controlled. By contrast with a pressure process, much finer structures can be applied to the semiconductor chip.

A flexible elevation produced from a semi-elastic plastics material has the following properties: it is compliant and it is compressible. Consequently, the flexible elevation does not act like a spring. The elasticity of the flexible elevation 3 is achieved exclusively by the geometrical shaping of the elevation. In the example, the flexible elevation 3 is relatively narrow in relation to its height. Such a configuration allows a spring effect to be achieved in the directions that lie parallel to the first surface 2 of the semiconductor chip 6. A spring effect orthogonally with respect to the first surface of the semiconductor chip 6 is not possible.

It is conceivable to provide the entire first surface of the semiconductor chip 6 with the plastic, i.e., with insulating layers 7 and flexible elevations 3. In a subsequent operation, the regions that are later to be provided with conductor runs 4 can be activated by a laser, i.e., roughened. A seeding of these activated conductor runs 4 subsequently takes place. As a result, the metallizations of the conductor runs 4 applied therein only continue to adhere at these locations. In an alternative, it would be conceivable to remove the entire insulating layer 7 at all locations, for example, by a laser, whereby the insulating layer 7 would be applied only at the locations on the first surface of the semiconductor chip 6 at which the conductor runs 9, 10 are later provided. The activation and seeding also take place in such a procedure.

Injection-compression molding offers the advantage that the flexible elevation 3 and the insulating layer 7 can be applied to the first surface of the semiconductor chip 6 in one operation. However, a one-step process is not absolutely necessary. It is similarly conceivable to apply the insulating layers 7 and the flexible elevations 3 to the semiconductor chip 6 in two separate compressing operations.

The same applies to the production of the flexible elevations 3 and the insulating layer 7 by an injection-molding operation. In such a case, a preformed mold with cavities is applied to the first surface 2 of the semiconductor chip 6, and the plastic is subsequently injected into the cavities. Here, too, it is possible to carry out such an operation either in one step or in two steps.

FIG. 9 shows the semiconductor chip according to the invention after the metallization 8 has been applied. As already described above, the metallization of the conductor runs 4 takes place only at the locations at which the plastic has been activated and seeded. In the exemplary embodiment, the metallization 8 has been applied in cross-section on the entire surface of the flexible elevation 3. The procedure is advantageous, in particular, whenever a test of the semiconductor chip is to be carried out before a soldered connection is produced between the semiconductor chip and a printed-circuit board.

In such a case, a temporary electrical connection can be established between the electrical contact 1 and a wiring plane provided with clearances 9 of the printed-circuit board. The electrical connection between the electrical contact 1 and the clearance 9 is established through the lateral conductor runs 4 of the flexible elevation 3. The electrical contacts 1 are, therefore, introduced into the clearances 9 of the wiring plane. The semiconductor chip and the printed-circuit board are subsequently displaced with the wiring plane parallel to the first surface 2 of the semiconductor chip 6, whereby the spring effect of the flexible elevations 3 is used to establish a contact between each individual electrical contact 1 and the clearance 9 of the wiring plane, provided laterally with conductors.

After adequate testing, either defective semiconductor chips can be removed or a solid soldered connection can be established between the semiconductor chips and the printed-circuit board.

Figure 10:
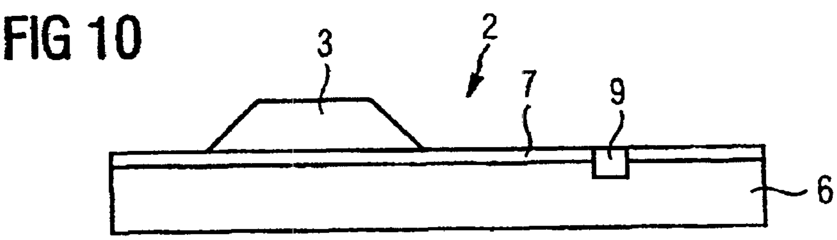
FIG. 10 is a cross-sectional view of a semiconductor chip according to the invention after an elastic, flexible elevation has been applied by injection-compression molding.
Figure 11:
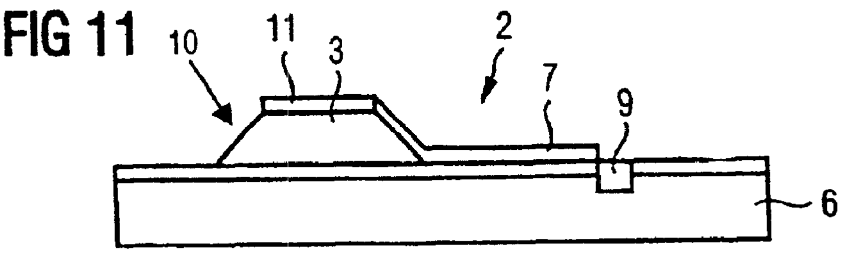
FIG. 11 is a cross-sectional view of the semiconductor chip of FIG. 10 after a semi-elastic, insulating layer has been applied.
Figure 12:
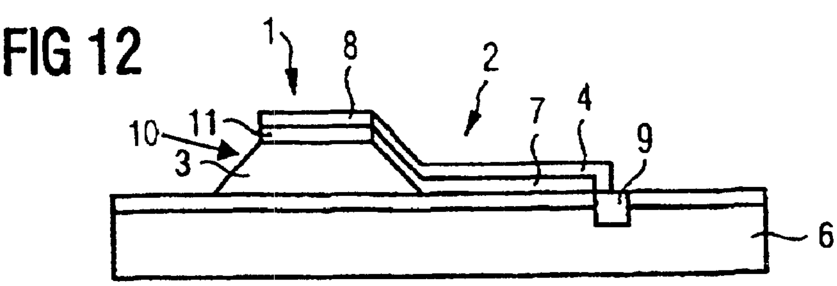
FIG. 12 is a cross-sectional view of the semiconductor chip of FIG. 11 after a metallization has been applied.

In FIGS. 10 to 12, the production of an electrical component in which the flexible elevation 3 includes an elastic element and a semi-elastic element is explained below by way of example. The application of the elastic elevation 3 may be performed either in an injection-compression process or in an injection-molding process.

In a first method step, the flexible elevation 3 of an elastic material, for example, silicone or polyurethane, is applied to the first surface 2 of the semiconductor chip 6. The material properties of elastic plastics are generally of such a nature that they cannot be metallized. For such a reason, it is necessary to apply an insulating and semi-elastic layer 7 to the elastic element. The insulating, semi-elastic layer 7 is applied both to parts of the first surface of the semiconductor chip 6 and to the surface of the flexible elevation 3. As can be seen from FIG. 11, however, a side face 10 of the flexible elevation 3 has had the insulating, semi-elastic layer 7 removed. The procedure is advantageous to assist the spring effect of the elastic element 3 of the flexible elevation 3. If the side face 10 were also covered with the insulating layer 7, under unfavorable circumstances the layer 7 could possibly tear.

The material properties of the insulating, semi-elastic layer 7 are now of such a nature that they can be activated by a laser and seeded. Consequently, a metallization can be subsequently applied to those regions of the insulating and elastic layer 7 that have previously been activated. The metallization of the conductor track runs is preferably performed without current, in other words, chemically.

The fact that an elastic element is used for the flexible elevation 3 means that the geometrical shaping of the flexible elevation 3 does not have to meet any special requirements. To make it easier for the insulating and elastic layer 7, 11 and the conductor runs 4, 8 to be applied, it is advantageous however to make the side faces of the flexible elevation 3 not run at right angles to the first surface 2 of the semiconductor chip 6. A shaping of the semiconductor component according to the procedure just described requires a two-part compression or injection-molding process.

The metallizations 8 of the flexible elevations in FIGS. 9 and 12 already form an electrical contact 1, by which the electrical bonding of the electronic component can take place. However, a solder ball (see reference numeral S in FIGS. 5 and 6) may be additionally attached on the flexible elevation, then forming the electrical contact 1. Such an embodiment is not illustrated in the figures.

Consequently, the method according to the invention for producing a semiconductor component with flexible bonding pads includes essentially three successive individual process steps. In a first step, a plastic, in particular, a polymer, which may already have been structured, is applied to a first surface 2 of a semiconductor chip. Subsequently, (heavy metal) nuclei contained in the plastic are activated, for example, by the use of UV light, of suitable chemical substances, or of a-priori nuclear-activated material. In a third step, a chemical, i.e., a currentless, metallization of the conductor runs can then be performed. When the plastic is applied to the semiconductor chip 6, the chip 6 advantageously already has the flexible elevations that form the subsequent electrical contacts of the semiconductor component.

We claim:

1. An electronic component, comprising:

an electronic circuit having a first surface;

electrical contacts at least on said first surface for electrical bonding of said electronic circuit;

at least one elevation disposed on said first surface, said at least one elevation having an elevation surface and a contact zone, said at least one elevation being formed of an insulating material having sufficient flexibility to absorb stresses occurring in said contact zone as a result of at least one of the group consisting of thermal loading and mechanical loading, and said at least one elevation having a geometrical shape for achieving a spring effect in directions extending parallel to said first surface;

at least one of said electrical contacts disposed on said at least one elevation; and a conduction path disposed on said elevation surface between said at least one of said electrical contacts and said electronic circuit.

2. The electronic component according to claim 1, including:

an insulating layer at least partially covering said first surface and adjoining said at least one elevation; and conductor runs disposed on said insulating layer and forming a conducting connection between said at least one elevation and said electronic circuit.

3. The electronic component according to claim 2, wherein said insulating layer at least partially covers said at least one elevation.

4. The electronic component according to claim 3, wherein said insulating layer is elastic.

5. The electronic component according to claim 1, wherein the electronic component is a semiconductor component.

6. The electronic component according to claim 5, wherein the electronic component is a polymer component.

7. The electronic component according to claim 1, wherein at least one of said electrical contacts is formed by one of the group consisting of a conducting layer, a conducting pin, and a conducting ball.

8. The electronic component according to claim 1, wherein said elevation is taller than it is wide.

9. An electronic component, comprising:

an electronic circuit having a first surface;

electrical contacts at least on said first surface for electrical bonding of said electronic circuit;

at least one elevation disposed on said first surface, said at least one elevation having a contact zone and an interior, said at least one elevation being formed of an insulating material having sufficient flexibility to absorb stresses occurring in said contact zone as a result of at least one of the group consisting of thermal loading and mechanical loading;

at least one of said electrical contacts disposed on said at least one elevation; and a conduction path disposed in said interior between said at least one of said electrical contacts and said electronic circuit.

10. The electronic component according to claim 9, including:

an insulating layer at least partially covering said first surface and adjoining said at least one elevation; and conductor runs disposed on said insulating layer and forming a conducting connection between said at least one elevation and said electronic circuit.

11. The electronic component according to claim 10, wherein said insulating layer at least partially covers said at least one elevation.

12. The electronic component according to claim 11, wherein said insulating layer is elastic.

13. The electronic component according to claim 9, wherein the electronic component is a semiconductor component.

14. The electronic component according to claim 13, wherein the electronic component is a polymer component.

15. The electronic component according to claim 9, wherein at least one of said electrical contacts is formed by one of the group consisting of a conducting layer, a conducting pin, and a conducting ball.

16. An electronic component, comprising:

an electronic circuit having a first surface;

electrical contacts at least on said first surface for electrical bonding of said electronic circuit;

at least one elevation disposed on said first surface, said at least one elevation having an elevation surface, an outwardly facing side face, and a contact zone, said at least one elevation being formed of an insulating material having sufficient flexibility to absorb stresses occurring in said contact zone as a result of at least one of the group consisting of thermal loading and mechanical loading;

at least one of said electrical contacts disposed on said at least one elevation;

an insulation layer only partially covering said at least one elevation by leaving said side face free of said insulation layer; and a conduction path at least partly disposed on at least part of said insulating layer partially covering said at least one elevation between said at least one of said electrical contacts and said electronic circuit.

17. The electronic component according to claim 16, wherein:

said insulating layer has rough regions;

at least one of said electrical contacts is disposed on said rough regions of said insulating layer; and a conduction path is disposed on said rough regions of said insulating surface between said at least one of said electrical contacts and said electrical circuit.

18. An electronic component, comprising:

an electronic circuit having a first surface;

electrical contacts at least on said first surface for electrical bonding of said electronic circuit;

at least one elevation disposed on said first surface, said at least one elevation including an elevation surface having rough regions and a contact zone, said at least one elevation being formed of an insulating material having sufficient flexibility to absorb stresses occurring in said contact zone as a result of at least one of the group consisting of thermal loading and mechanical loading;

at least one of said electrical contacts disposed on said rough regions of said elevation surface; and a conduction path disposed on said rough regions of said elevation surface between said at least one of said electrical contacts and said electronic circuit.

19. The electronic component according to claim 18, wherein said rough regions include nuclei.

20. The electronic component according to claim 19, wherein the nuclei are palladium.

* * * * *